United States Patent
Yin et al.

(10) Patent No.: US 8,324,061 B2
(45) Date of Patent: Dec. 4, 2012

(54) METHOD FOR MANUFACTURING SEMICONDUCTOR DEVICE

(75) Inventors: Huaxiang Yin, Beijing (CN); Qiuxia Xu, Beijing (CN); Gaobo Xu, Beijing (CN); Lingkuan Meng, Beijing (CN); Tao Yang, Beijing (CN); Dapeng Chen, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 86 days.

(21) Appl. No.: 13/129,419

(22) PCT Filed: Feb. 17, 2011

(86) PCT No.: PCT/CN2011/071060
§ 371 (c)(1),
(2), (4) Date: May 16, 2011

(87) PCT Pub. No.: WO2012/083604
PCT Pub. Date: Jun. 28, 2012

(65) Prior Publication Data
US 2012/0164808 A1    Jun. 28, 2012

(30) Foreign Application Priority Data
Dec. 22, 2010  (CN) .................... 2010 1 0601699

(51) Int. Cl.
*H01L 21/336* (2006.01)
(52) U.S. Cl. .................. 438/303; 257/E21.432
(58) Field of Classification Search .......... 438/307, 438/976; 257/E21.432
See application file for complete search history.

(56) References Cited

U.S. PATENT DOCUMENTS

| | | | |
|---|---|---|---|
| 5,316,890 A | 5/1994 | Okamura et al. | |
| 5,316,980 A | 5/1994 | Takeshiro et al. | |
| 5,747,381 A | 5/1998 | Wu et al. | |
| 6,743,683 B2 * | 6/2004 | Barns et al. | 438/299 |
| 7,026,196 B2 * | 4/2006 | Hou et al. | 438/151 |

FOREIGN PATENT DOCUMENTS

CN   101661902 A   3/2010

OTHER PUBLICATIONS

Espacenet English Abstract for on 101661902 (1 page), (2010).
International Search Report and Written Opinion dated Aug. 18, 2011, issued by the Chinese Patent Office in related Chinese Application No. PCT/CN2011/071060 (9 pages).

* cited by examiner

*Primary Examiner* — Chandra Chaudhari
(74) *Attorney, Agent, or Firm* — Osha Liang LLP

(57) ABSTRACT

A method for manufacturing a semiconductor device includes the steps of: forming a first gate stack on a semiconductor substrate, the first gate stack includes a first gate conductor and a first gate dielectric between the first gate conductor and the semiconductor substrate; forming source/drain regions on the semiconductor substrate; forming a multilayer structure including at least one sacrificial layer and at least one insulating layer under the sacrificial layer on the semiconductor substrate and the first gate stack; performing a first RIE on the multilayer structure; performing a second RIE on the multilayer structure; selectively etching the first gate stack with respect to the insulating layer, in which the first gate conductor is removed and an opening is formed in the insulating layer; and forming a second gate conductor in the opening.

15 Claims, 6 Drawing Sheets

METHOD FOR MANUFACTURING SEMICONDUCTOR DEVICE

This application is a Section 371 National Stage Application of International Application No. PCT/CN2011/071060, filed on Feb. 17, 2011, which claims priority to CN 201010601699.9, filed on Dec. 22, 2010, the entire contents of which are incorporated herein by reference in their entirety.

BACKGROUND OF THE INVENTION

1. Field of Invention

The present invention relates to a method for manufacturing a semiconductor device, and more particularly to a method for manufacturing a semiconductor device by a gate-last process.

2. Description of Prior Art

Semiconductor devices have continued to decrease in size. A polysilicon gate is typically used but impedes an improvement of properties of a metal oxide semiconductor (MOS) device, because it has an excessively high gate resistance, a polysilicon depletion effect, and a boron penetration effect in a PMOS transistor. Moreover, an integration of the polysilicon gate with a high K dielectric usually introduces a large amount of interface defects, which causes a threshold voltage pinning effect of the device and reduces carrier mobility in a channel. Therefore, a gate structure in which a polysilicon gate is replaced with a metal gate is proposed.

A process of integrating a metal gate/high K gate stack in a MOS device includes a gate-first process and a gate-last process. In the gate-first process, the metal gate/high K gate stacks are firstly formed, and dopant implantation and activation anneal steps are then performed in source/drain regions. In the step of activation anneal for the source/drain regions, most of the metal gates react with the high K gate dielectric. Hence, in the gate-first process, the materials of the metal gate are constrained, which in turn suppresses an improvement of the threshold voltage. However, in the gate-last process, a dummy gate (i.e. a sacrificial gate) of for example the polycrystalline silicon is firstly formed, and dopant implantation and activation anneal steps are then performed in source/drain regions. Finally, the dummy gate is removed and the metal gate (i.e. a replacement gate) is formed. In the gate-last process, the material of the metal gate does not undergo the step of activation anneal in the source/drain regions. A temperature of the process after the metal gate is formed is generally lower than 500° C. With the gate-last process, more kinds of materials can be used for the metal gate, so as to obtain a desired threshold voltage and to reduce defect density at an interface between the metal gate and high K. Therefore, the gate-last process has become an increasingly attractive choice for integration of the metal gate.

In the gate-last process, an Interlayer Dielectric (ILD) layer is required to cover the dummy gate after the dummy gate is formed. A planar surface of the ILD layer is formed by Chemical Mechanical Polishing (CMP). Then, the dummy gate is removed and an opening is formed due to the removal of the dummy gate. The opening is filled with the material of the metal gate.

Further, a metal wiring layer is separated from an active layer of the semiconductor device by the ILD layer. The electric connection between the metal wiring layer and the active layer of the semiconductor device can be implemented by means of conductive vias through the ILD layer. The ILD layer having the planar surface is beneficial for depositing and patterning the metal gate material, and also is beneficial for electrical isolation between the metal wiring layer and the underlying layer of the semiconductor device, and further is beneficial for forming multi-level metal wiring interconnections. The ILD layer having the planar surface also improves mechanical strength and reliability of the semiconductor device, because there is no defect such as holes.

However, compared with the gate-first process, the gate-last process includes an additional CMP process in order to provide the ILD layer having the planar surface, which increase complexity and costs of the gate-last process, especially for a first insulating layer for isolating the gate stack structure with a super small gate length.

The CMP process can be replaced with a dual-layer ILD layer structure provided by firstly depositing a conformal insulating layer, such as including a low temperature oxide (LTO) layer, and then depositing a spin-on glass (SOG) layer thereon, wherein the LTO layer forms a conformal layer which covers a large area of a wafer, and the SOG layer further fills recesses on the surface, and thus a substantially planar surface can be obtained.

Then, in order to further form a flatter planar surface, the SOG layer can be etched back by using dry etching method, such as reactive ion etching (RIE), so as to planarize its surface. Typically, a mixture of trifluoromethane ($CHF_3$), tetrafluoromethane ($CF_4$) and Oxygen ($O_2$) is used as an etching gas in the RIE.

In U.S. Pat. No. 5,316,980A of Shinichi Takeshiro etc., it is further proposed that a mixture of trifluoromethane ($CHF_3$) and hexafluoroethane ($C_2F_6$) can be used as the etching gas, so that an etching rate of the organic SOG layer is lower than that of an underlying $SiO_2$ layer. Consequently, a planar surface of the structure can still be provided even in a case that the underlying $SiO_2$ layer is partly exposed.

However, the SOG layer etching method mentioned above actually can not achieve global planarization. It has been found that the etching rate of the SOG layer at the center of the wafer is lower than that at the edge of the wafer. As will be described, the etched SOG layer has a convex etching profile. As a result, the edge of the wafer has to be discarded since the thickness of SOG layer at the edge can not achieve the desired flatness and should be discarded, which reduces an available area of the wafer for manufacturing the semiconductor device.

SUMMARY OF THE INVENTION

One object of the present invention is to provide a method for manufacturing a semiconductor device by a gate-last process, wherein a CMP process is replaced with an etching process so as to provide a planar ILD layer surface and achieve a larger available wafer area.

According to the present invention, a method for manufacturing a semiconductor device is provided. The method comprises the steps of: forming a first gate stack on a semiconductor substrate, the first gate stack comprising a first gate conductor and a first gate dielectric between the first gate conductor and the semiconductor substrate; forming source/drain regions on the semiconductor substrate; forming a multilayer structure including at least one sacrificial layer and at least one insulating layer under the sacrificial layer on the semiconductor substrate and the first gate stack; performing a first RIE on the multilayer structure, in which a reaction chamber pressure is controlled in such a manner that an etching rate of the portion of the at least one sacrificial layer at a center of a wafer is higher than that at an edge of the wafer, in order to obtain a concave etching profile; performing a second RIE on the multilayer structure to completely remove the sacrificial layer and a part of the insulating layer, in order to obtain the insulating layer having a planar surface which serves as an interlayer dielectric layer; selectively etching the first gate stack with respect to the insulating layer, in which the first gate conductor is removed and an opening is formed in the insulating layer; and forming a second gate conductor in the opening.

Preferably, an additional RIE is inserted between the first RIE and the second RIE, in which a reaction chamber pressure is controlled in such a manner that an etching rate of the portion of the at least one sacrificial layer at the center of the wafer is lower than that at the edge of the wafer, so as to reduce a concave degree of the concave etching profile.

The method of the present invention performs etchback on the multilayer structure comprising at least one sacrificial layer and at least one insulating layer by two or three steps of RIE which replaces a Chemical Mechanical Polishing (CMP) process. The method not only eliminates conformal characteristic on the whole ILD layer, which achieves a good local planarization, but also compensates for overetching of the insulating layer at the edge of the wafer, which achieves a global planarization on the whole wafer and significantly increases an available area of the wafer.

The insulating layer after etchback has a planar surface. Thus, it is not necessary to be processed by a CMP process using an expensive CMP equipment. The process time can be saved and manufacturing costs of the device can be reduced.

The two or three steps of RIE in the planarization process may expose a gate conductor directly and form a recess in an LTO layer at the top of the gate conductor. It facilitates wet etching for removing a dummy gate in subsequent steps, which provides an access path aligned with the dummy gate for an etchant, without an additional mask and a patterning process being used.

The two or three steps of RIE in the planarization process can be performed successively in the same reaction chamber, with a specific etching gas, a specific reaction chamber pressure, a specific RF power used for each RIE step. Thus, the process of manufacturing the semiconductor device can be simplified.

The sacrificial layer material can be various materials which are well-known and suitable for RIE, even for photoresist. Compared with SOG, spin coating and curing of photoresist are much simpler processes, which reduces complexity of the process introduced by the sacrificial layer.

DETAILED DESCRIPTION OF PREFERRED EMBODIMENTS

Figure 1:
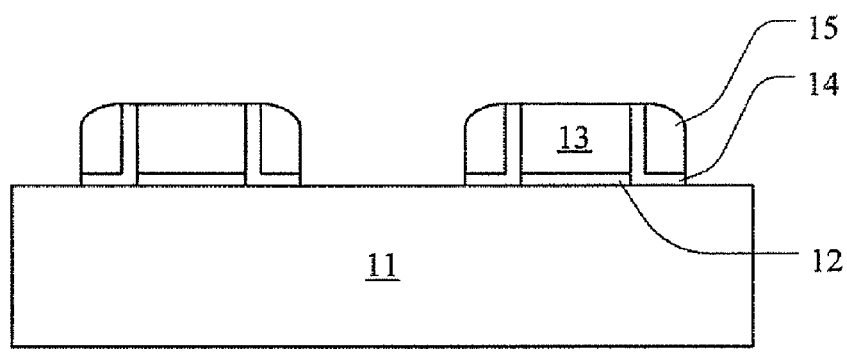
FIG. 1 shows a schematic cross sectional view of a semiconductor structure after a dummy gate is formed according to the prior-art gate-last process.

Exemplary embodiments of the present invention are described in more details below with reference to the accompanying drawings. In the drawings, like reference numerals denote like members. The figures are not drawn to scale, for the sake of clarity.

Some particular details of the invention will be described below, such as an exemplary semiconductor structure, material, dimension, process step and manufacturing method of the device, for a better understanding of the present invention. Nevertheless, it can be understood by one skilled person in the art that these details are not always essential for but can be varied in a specific implementation of the invention. Unless the context clearly indicates otherwise, each part of the semiconductor device can be made of material(s) well known to one skilled person in the art.

FIG. 1 shows a schematic cross sectional view of a semiconductor structure after a dummy gate is formed according to the prior-art gate-last process, wherein a gate stack, including a gate dielectric 12 and a gate conductor 13 on the gate dielectric 12, can be formed on a semiconductor substrate 11, and gate spacers, including an oxide layer 14 and a nitride layer 15, are formed at two sides of the gate stack. The gate conductor 13 (e.g., polycrystalline silicon) in the gate stack structure is used as a dummy gate, which will be removed after a planar ILD layer is formed, and will be replaced with a metal gate, i.e., a replacement gate. The gate dielectric 12 can be replaced with a new gate dielectric 12'.

Although not shown, it can be understood that the gate stack is used as a barrier layer for forming self-aligned source/drain regions in the substrate 11 by ion implantation. Then, the dopants are activated by a rapid thermal anneal.

Although not shown, it can be understood that preferably, a hard mask such as $SiO_2$ is formed on the top of the gate stack (e.g. in a process of manufacturing the gate stack having a supper small gate length by RIE), before the ion implantation for the source/drain regions, so as to define an implantation area and a non-implantation area better during the ion implantation for the source/drain regions, and to define a silicide area better in a silication step.

Although not shown, it can be understood that preferably, a metal layer (e.g., Ni, NiPt, Ti or Co) is deposited on the source/drain regions with the spacers and the hard mask as a barrier layer, and the metal layer is silicated to form self-aligned metal silicide so as to reduce a contact resistance between a wiring layer and an active layer, after the ion implantation for the source/drain regions.

Figure 2:
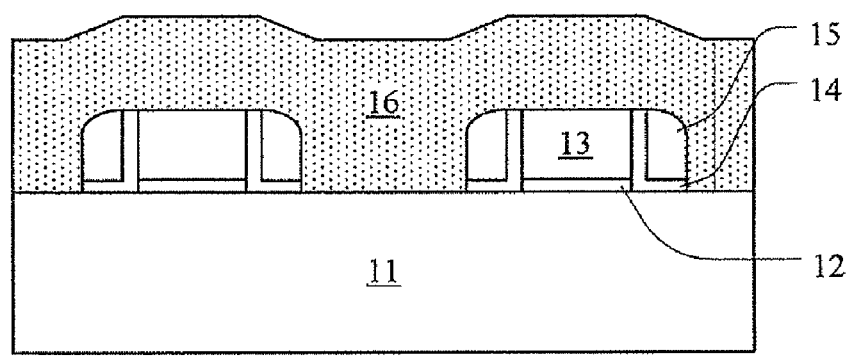
FIG. 2 shows a schematic cross sectional view of the semiconductor structure after an LTO layer is deposited on the semiconductor structure as shown in FIG. 1.
Figure 3:
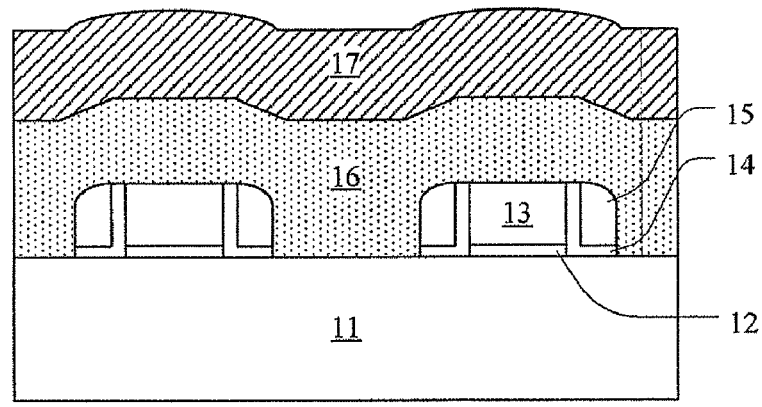
FIG. 3 shows a schematic cross sectional view of the semiconductor structure after an SOG layer is spun on the semiconductor structure as shown in FIG. 2.

Then, an LTO layer 16 and a spin-on SOG layer 17 are subsequently deposited on the semiconductor structure as shown in FIG. 1, which are illustrated in FIGS. 2 and 3 respectively. A chemical vapor deposition process for forming the LTO layer 16 and a spin-on process for forming the SOG layer 17 are well-known in the art.

In the following etching step, the SOG layer 17 is removed as a sacrificial layer, and the LTO layer 16 is used as an interlayer dielectric (ILD) layer of the resultant device. Hereinafter, in order to meet requirements for a planarization process, the thickness of the LTO layer 16 is about 50 nm to 3000 nm, and the thickness of the SOG layer 17 is about 50 nm to 2000 nm.

The LTO layer 16 and the SOG layer 17 are substantially conformal. That is, the portion of the LTO layer 16 and the SOG layer 17 that covers the gate stack exhibits a convex shape to a certain extent.

Figure 4:
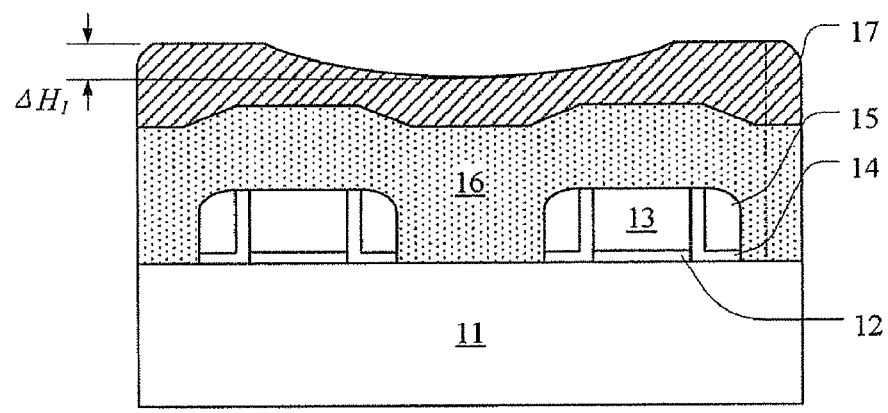
FIG. 4 shows a schematic cross sectional view of the semiconductor structure after a first etchback is performed on the SOG layer according to the method of the present invention.

According to the etching method of the present invention, the first etchback is performed on the SOG layer for the semiconductor structure having the LTO layer 16 and the SOG layer 17 as shown in FIG. 3 by RIE, as illustrated in FIG. 4. In this embodiment, a Rainbow 4420 type plasma etcher (available from Lam Research Corporation, U.S.) is used. The RIE process is performed with about 450 W RF power and an etching gas which is a mixture of trifluoromethane ($CHF_3$), tetrafluoromethane ($CF_4$) and argon gas (Ar). The flow of $CHF_3$ is about 50 sccm, the flow of $CF_4$ is about 15 sccm, and the flow of Ar is about 300 sccm. The pressure in the reaction chamber is maintained to 350 mtorr.

During etching, an etchback time is controlled in such a manner that the RIE removes only the SOG layer 17, but does not reach a top surface of the LTO layer 16.

The etchback on the SOG layer 17 achieves a good local planarization. The surface of the SOG layer 17 becomes flat where the gate stack is covered.

Moreover, an etching rate of the SOG layer 17 at a center portion of the wafer is higher than that at an edge of the wafer. Less SOG remains at the center of the wafer than that at the edge of the wafer. As a result, the etched SOG layer 17 has a concave profile.

The measurement results show that a maximum of a height difference $\Delta H_1$ of the surface shape is only about 20 nm $\leq \Delta H_1 \leq$ 75 nm, and a slope (which is defined as a ratio of the height difference of the surface shape between the center and the edge of the wafer and a radius of the wafer) is about between 5e-7 and 2e-6. Thus, it is guaranteed that the available area of the wafer is not substantially reduced.

The inventor found that for the etching on the SOG layer 17, the etching rate at the edge of the wafer is higher than that at the center of the wafer under a conventional lower atmospheric pressure (<325 mtorr), so as to form a convex etching profile and produce a smaller available diameter of the wafer; while under a higher atmospheric pressure (>325 mtorr) used in the present invention, the etching rate at the edge of the wafer is lower than that at the center of the wafer (the difference between the etching rates is higher than 0 and lower than 20 Å/s), which may form a concave etching profile as shown in FIG. 4. A setting value of an optimal pressure is slightly high, which is about 350 mtorr, so as to obtain the concave etching profile and a quicker etching rate as desired in the present invention.

Moreover, the inventor found that the etching rate at the edge of the wafer is lower than that at the center of the wafer, and is varied substantially as a linear function of the RF power, in a range of the RF power from 350 W to 550 W, at a pressure of 350 mtorr. Thus, the concave etching profile as described above is formed, and a larger available diameter of the wafer is achieved. Therefore, variation of the RF power may not completely change the shape of the etching profile (i.e. from convex to concave, or vice versa), which is contrary to the effect of pressure. A maximum etching rate difference is obtained under about 450 W of RF power, which, in other words, provides a concave etching profile having a maximum relative height difference. It achieves a maximum available diameter of the wafer.

At the etching step in the above embodiment according to the method of the present invention, the pressure of the reaction chamber is higher than about 325 mtorr, the optimal value of the pressure in the reaction chamber is about 350 mtorr, and the optimal RF power is about 450 W.

However, it is appreciated that specific values of the pressure of the reaction chamber and the RF power may depend on the type of the etcher, the spacing between the electrodes, the volume of the reaction chamber, and compositions, proportion, and flow of the etching gas.

Figure 5:
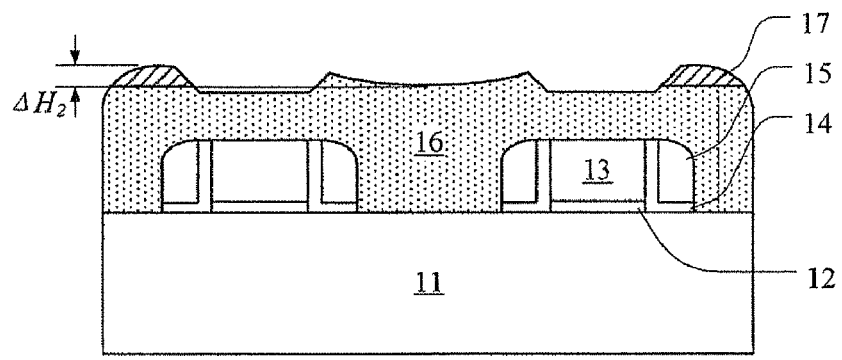
FIG. 5 shows a schematic cross sectional view of the semiconductor structure after a second etchback is performed on the SOG layer according to the method of the present invention.

As an alternative step, a second etchback is performed on the SOG layer for the semiconductor structure in which the first etchback has been performed on the SOG layer as shown in FIG. 4, according to the etching method of the present invention, as illustrated in FIG. 5. Both of this etching step and the step of the first etchback on the SOG layer are performed in the same reaction chamber, and can use the same etching gas having the same compositions and the same proportion. For example, it is performed with about 400 W of RF power and an etching gas which is a mixture of trifluoromethane ($CHF_3$), tetrafluoride ($CF_4$) and argon (Ar) gas, wherein the flow of $CHF_3$ is about 50 sccm, the flow of $CF_4$ is about 15 sccm, and the flow of Ar is about 300 sccm, and the pressure in the reaction chamber is maintained at 250 mtorr.

In fact, the process condition of the second etchback on the SOG layer can be the same as that of the conventional etchback on the SOG layer as shown in FIG. 4. Thus, the same etching characteristic is obtained. That is, in the step of second etchback on the SOG layer, the etching rate of the SOG layer 17 at the center of the wafer is lower than that at the edge of the wafer.

During the second etchback on the SOG layer, firstly a portion of the SOG layer 17 at the center of the wafer which has a smaller thickness is removed, and optionally, a portion of the LTO layer 16 at the center of the wafer is slightly overetched at the center of the wafer. An amount of overetching on the LTO layer 16 is in a range of 5 nm to 80 nm. Typically, the etching rate of the second etchback on the SOG layer is lower than that of the first etchback on the SOG layer, so that the amount of the overetching on the LTO layer 16 is easily controlled.

After the second etchback on the SOG layer 17, most parts of the LTO layer 16 under the SOG layer 17 is exposed. It is possible that some SOG remains at the edge of the wafer, so as to eliminate an overetching area of the LTO layer 16 at the edge of the wafer.

The measurement results show that a maximum of a height difference $\Delta H_2$ of the surface shape is only about 0 nm $\leq \Delta H_2 \leq$ 30 nm, and a slope is about between 0 and 7.5e-7.

The second etchback on the SOG layer may reduce the concave degree of the SOG layer 17 after the first etchback on the SOG layer is performed, so that the surface is close to a planar surface. On one hand, it provides a flatter planar surface, and on the other hand, it is guaranteed that the available area of the wafer is not reduced substantially.

Figure 6:
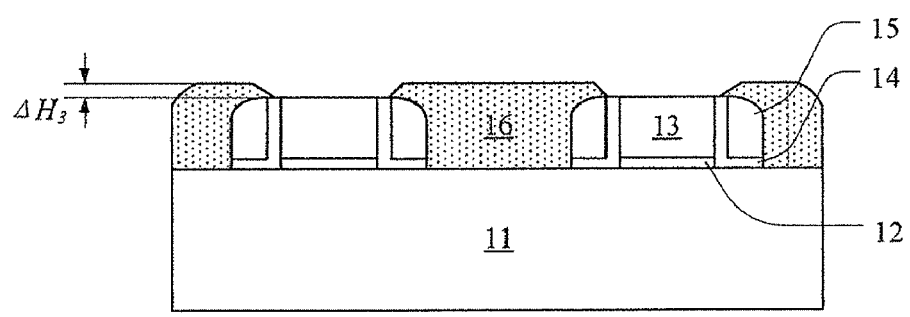
FIG. 6 shows a schematic cross sectional view of the semiconductor structure after an etchback is performed on the LTO layer according to the method of the present invention.

FIG. 6 shows a schematic cross sectional view of the semiconductor structure after the etchback is performed on the LTO layer by RIE according to the etching method of the present invention. This etching step is performed in the same reaction chamber as the steps of the first and alternative second etchback on the SOG layer, and can use the same etching gas having the same compositions but the different proportions. For example, it is performed with about 550 W of RF power and an etching gas which is a mixture of trifluoromethane ($CHF_3$), tetrafluoromethane ($CF_4$) and argon gas (Ar), wherein the flow of $CHF_3$ is about 25 sccm, the flow of $CF_4$ is about 25 sccm, and the flow of Ar is about 300 sccm, and the pressure in the reaction chamber is maintained at 250 mtorr.

Actually, the process condition of the etchback on the LTO layer is the same as that of the conventional etchback on the LTO layer as shown in FIG. 5. Thus, the same etching characteristic is obtained. That is, the etching rate of the LTO layer 16 at the edge of the wafer is higher than that at the center of the wafer.

In this etchback step, firstly the remaining portion of SOG layer 17 at the top of the LTO layer 16 at the edge of the wafer is removed, and then the LTO layer 16 is further etched.

As illustrated above, after the first and the second etchback on the SOG layer 17, the profile of the SOG layer 17 has a concave shape. What is more, a part of the LTO material underneath has been overetched at the center of the wafer. In the step of the etchback on the LTO layer 16, the portion of the LTO layer 16 at the edge of the wafer is covered by the SOG layer 17 at the start of the etching, and thus undergoes etching later.

The SOG layer 17 is used as the sacrificial layer, which provides the concave etching profile during the etching, so as to compensate for the overetching on the LTO layer 16 at the edge of the wafer, and to obtain a global planarization of the whole wafer.

Under the above etching conditions, an etching rate at the LTO layer is higher than that on the SOG layer, the ratio of which is 2:1. In this case, the etch rate of LTO at the center is slower because the portion of the LTO layer 16 at the center of the wafer is covered by the SOG layer; while the portion of the LTO layer 16 at the edge of the wafer is etched more quickly. As a result, the portion of the LTO layer 16 at the edge of the wafer will become thinner. After etchback of both the SOG layer and the LTO layer, the surface of the whole wafer is much flatter due to the compensation effect. Although the edge of the wafer is slightly overetched, an available area of the wafer is significantly larger than that according to the etching method in the prior art.

The resulting ILD layer includes only the remaining LTO layer 16, and has a substantially planar profile.

Furthermore, the portion of the LTO layer 16 at the top of the gate conductor 13 is exposed firstly, and thus the etching thereon is more quickly. The portion of the LTO layer 16 on the source/drain regions is etched more slowly due to the coverage of the SOG layer. A slightly concave profile is formed on the gate conductor 13. The portion of the LTO layer 16 at the top of the gate conductor 13 is completely removed to expose to the gate conductor 13. And, a recess is formed on the LTO layer 16 at the top of the gate conductor 13, as illustrated in FIG. 6. A local height difference between the surface shapes of the top and the surrounding of the gate conductor 13 is $0 \leq \Delta H_3 \leq 40$ nm.

Then, the method of removing the gate conductor 13 is typically Cl-base RIE or TMAH wet-etching. Both of these two methods have extremely high etching selectivity with respect to silicon dioxide. Any of the remaining silicon dioxide on dummy gate is easy to impede the removal of the gate conductor 13. Such a recess structure facilitates the removal of the gate conductor 13.

In the subsequent step of removing the gate conductor 13 (not shown), the Cl-base RIE method or a TMAH wet-etching method is used. Since the top of the gate conductor 13 has been exposed and the recess as described above has been formed, the etchant may reach the gate conductor 13, and thus the gate conductor 13 is easily removed.

Figure 7:
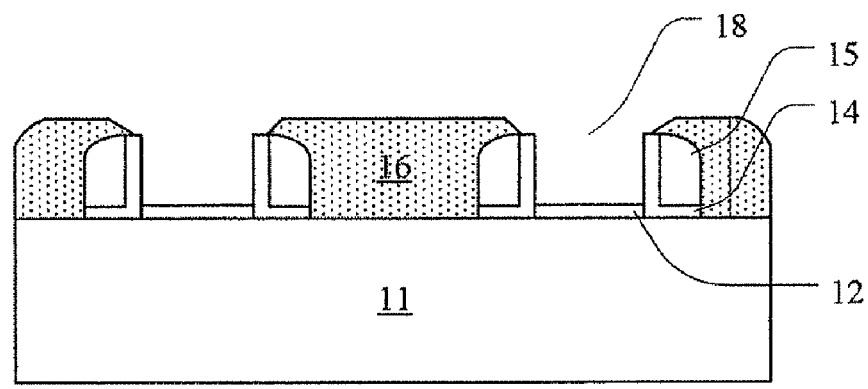
FIG. 7 shows a schematic cross sectional view of the semiconductor structure after a polycrystalline silicon dummy gate is removed according to the method of the present invention.

FIG. 7 shows a schematic cross sectional view of the semiconductor structure after a polycrystalline silicon dummy gate is removed according to the method of the present invention, wherein the wet etching is used for selectively removing the gate conductor 13 with respect to the LTO layer 16, so as to form an opening 18 whose is bottom is gate dielectric 12. The selective etching of the gate conductor 13 (e.g. polysilicon) is well-known. Preferably, the gate dielectric 12 can also be removed.

Figure 8:
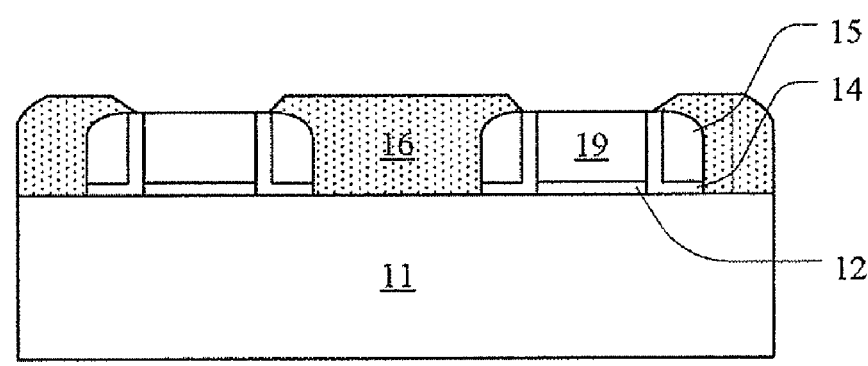
FIG. 8 shows a schematic cross sectional view of the semiconductor structure after a metal gate is formed according to the method of the present invention.

FIG. 8 shows a schematic cross sectional view of the semiconductor structure after a metal gate is formed according to the method of the present invention, wherein the opening 18 is filled with materials of the metal gate 19. The metal gate 19 may consist of refractory metals such as W, Ti, Ta, Mo etc. and metal nitrides such as TiN, TaN, HfN, MoN etc. The metal gate 19 is formed using e.g. a low pressure chemical vapor deposition, a metal organic chemical vapor deposition, an atomic layer deposition, sputtering etc. Alternatively, the thickness of the metal gate 19 is 20-5000 Å.

Alternatively, in the steps as illustrated in FIG. 7, not only the gate conductor 13 is removed, but also the gate dielectric 12 on the bottom is further removed, so that the bottom of the opening is the surface of the top of the semiconductor substrate 11. Then, in the steps as shown in FIG. 8, a new gate dielectric and a metal gate electrode is re-deposited.

After the steps as illustrated in FIGS. 1-8 are completed, through vias in the ILD layer 16, and wiring or contacting on the upper surface of the ILD layer 16 are formed on the resulting semiconductor structure according to the method well-known in the prior art, so as to finish other parts of the semiconductor device.

Figure 9:
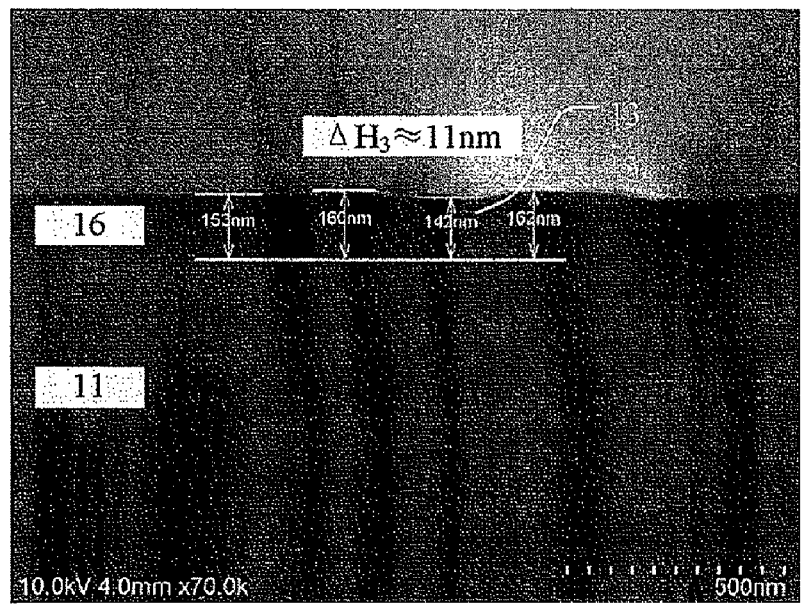
FIG. 9 shows an X-SEM image of the semiconductor structure after the etchback is performed on the LTO layer according to the method of the present invention.

Referring to FIG. 9, FIG. 9 shows an X-SEM image of the semiconductor structure after the etchback is performed on the LTO layer according to the method of the present invention. The local height difference between the surface shapes of the top and the surrounding of the gate conductor 13 is $\Delta H_3 \approx 11$ nm, which clearly shows a recess on the top of the gate conductor 13.

Figure 10:
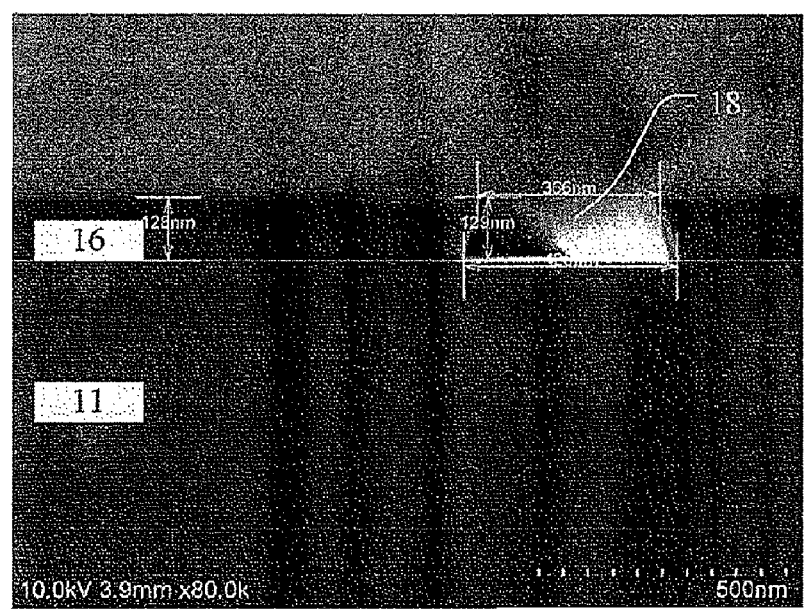
FIGS. 10 and 11 show X-SEM images of the semiconductor structure for different gate lengths after the polycrystalline silicon dummy gate is removed according to the method of the present invention.
Figure 11:
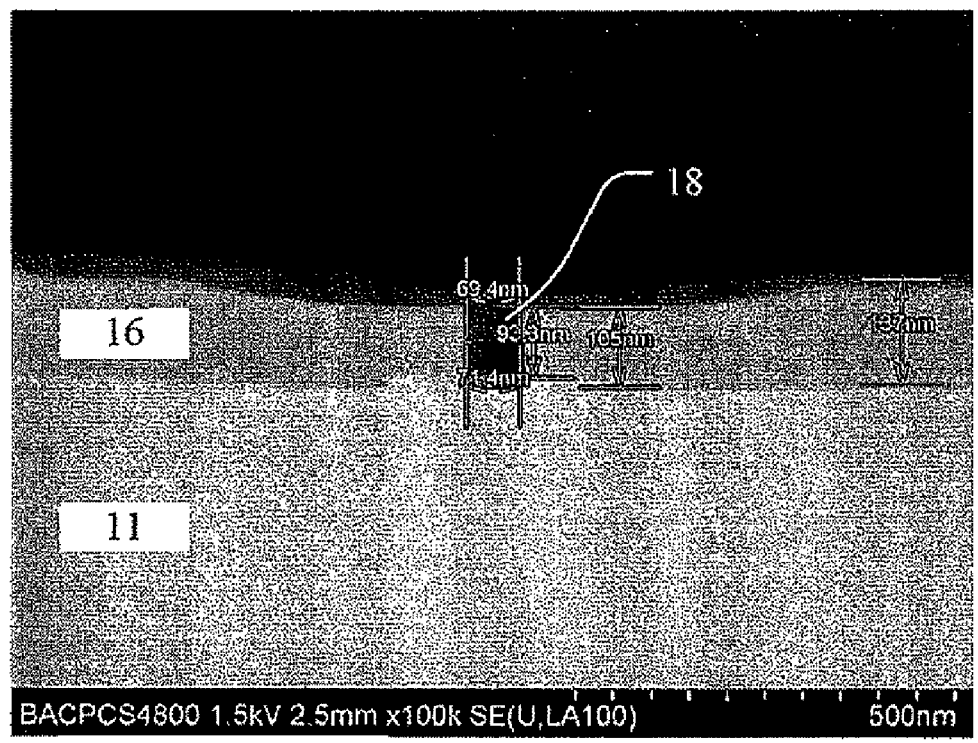

FIGS. 10 and 11 show X-SEM images of the semiconductor structure for different gate lengths after the polycrystalline silicon dummy gate is removed according to is the method of the present invention. The gate length as illustrated in FIG. 10 is about 0.4 μm, and its height is about 130 nm. The gate length as illustrated in FIG. 11 is about 70 μm, and its height is about 93 nm. As shown in FIGS. 10 and 11, since the profile of the ILD layer 16 facilitates the wet-etching, the gate conductor 13 is removed well even if the gate length is small, and the surrounding material of the LTO layer 16 does not undergo etching. FIG. 8 shows the cross sectional view of the semiconductor structure after the metal gate is formed according to the method of the present invention, wherein the opening is filled with the materials of the metal gate 19. The metal gate 19 may consist of the refractory metals such as W, Ti, Ta, Mo etc. and the metal nitrides such as TiN, TaN, HfN, MoN etc. The metal gate 19 is formed using e.g. the low pressure chemical vapor deposition, the metal organic chemical vapor deposition, the atomic layer deposition, sputtering etc. Alternatively, the thickness of the metal gate 19 is 20-5000 Å.

The above embodiments describe that the etchback on the SOG layer/LTO layer is used for planarization, so as to obtain the LTO layer 16 having a planar surface which serves as the resultant ILD layer. However, the sacrificial layer of other materials is possible, e.g. photoresist, low K material etc.

For example, the etchant for the photoresist layer is a mixture of argon gas (Ar) and oxygen (O$_2$), wherein the flow of Ar is about 300 sccm, and the flow of O$_2$ is about 5 ccm.

The measurement results similar with that on the SOG layer show that a desired etching rate distribution is obtained, and the concave etching profile as described above is formed, when a reaction chamber pressure is higher than 275 mtorr (the optimal pressure of the reaction chamber is about 300 mtorr) and the RF power is about 300-550 W (the optimal RF power is about 500 W).

However, it can be understood that the specific values of a reaction chamber pressure and the RF power may depend on the type of the etcher, the spacing between the electrodes, the volume of the reaction chamber, and compositions, proportion, and flow of the etching gas.

The RIE method of the photoresist layer may use other etching gases well known for the photoresist layer, such as a mixture of one or more types of oxygen (O$_2$) and tetrafluoromethane (CF$_4$) with argon (Ar) gas. A concave etching profile can still be achieved by controlling a reaction chamber pressure. Moreover, a depth of the concave etching profile can still be adjusted by controlling an RF power. Consequently, a global planarization is optimized and an available area of the wafer is maximized.

As illustrated above, in the present invention, planarization can be implemented with etching a two-layer structure including the sacrificial layer and the insulating layer under the sacrificial layer, wherein the insulating layer is used as ILD. In the etching step, the sacrificial layer provides a concave etching profile, so as to compensate for the overetching on the portion of the insulating layer at the edge of the wafer. However, the present invention may also be applied to a multilayer structure, including at least one sacrificial layer and the insulating layer as ILD. The sacrificial layer may consist of one of SOG, photoresist, and low K material. The insulating layer may consist of one of BPSG, SiO$_2$, and SiNx. For example, the two-layer or multilayer structure used for the etching of ILD can be SiO$_2$/SiNx, LTO/SOG/LTO, S$_i$OF/LTO, low K/LTO, LTO/low K/LTO.

While the invention has been described with reference to specific embodiments, the description is illustrative of the invention. The description is not to be considered as limiting the invention. Various modifications and applications may occur for those skilled in the art without departing from the true spirit and scope of the invention as defined by the appended claims.

What is claimed is:

1. A method for manufacturing a semiconductor device, comprising the steps of:
    forming a first gate stack on a semiconductor substrate, the first gate stack comprising a first gate conductor and a first gate dielectric between the first gate conductor and the semiconductor substrate;
    forming source/drain regions on the semiconductor substrate;
    forming a multilayer structure including at least one sacrificial layer and at least one insulating layer under the sacrificial layer on the semiconductor substrate and the first gate stack;
    performing a first RIE on the multilayer structure, in which a reaction chamber pressure is controlled in such a manner that an etching rate of the portion of the at least one sacrificial layer at a center of a wafer is higher than that at an edge of the wafer, in order to obtain a concave etching profile;
    performing a second RIE on the multilayer structure to completely remove the sacrificial layer and a part of the insulating layer, in order to obtain the insulating layer having a planar surface which serves as an interlayer dielectric layer;
    selectively etching the first gate stack with respect to the insulating layer, in which the first gate conductor is removed and an opening is formed in the insulating layer; and
    forming a second gate conductor in the opening.

2. The method according to claim 1, further comprising an additional RIE between the first RIE and the second RIE, in which a reaction chamber pressure is controlled in such a manner that an etching rate of the portion of the at least one sacrificial layer at the center of the wafer is lower than that at the edge of the wafer, so as to reduce a concave degree of the concave etching profile.

3. The method according to claim 1, wherein the first RIE is performed at least to a depth that a top surface of the insulating layer is exposed at the center of the wafer.

4. The method according to claim 3, wherein the first RIE further overetches the insulating layer at the center of the wafer.

5. The method according to claim 2, wherein the first RIE and the additional RIE are performed in an etching gas having the same compositions and the same proportions, and a reaction chamber pressure for the first RIE is higher than that for the additional RIE.

6. The method according to claim 5, wherein in the first RIE, an RF power is controlled in such a manner that the difference between an etching rate at the portion of the at least one sacrificial layer at the center of the wafer and an etching rate at the portion of the at least one sacrificial layer at the edge of the wafer is maximized.

7. The method according to claim 1, wherein the at least one sacrificial layer consists of one selected from the group consisting of SOG, photoresist, and low K material.

8. The method according to claim 7, wherein the at least one sacrificial layer is an SOG layer, and the etching gas in the first RIE is a mixture of trifluoromethane, tetrafluoromethane and argon gas.

9. The method according to claim 7, wherein the at least one sacrificial layer is a photoresist layer, and the etching gas in the first RIE is a mixture of oxygen and argon gas.

10. The method according to claim 1, wherein the insulating layer consists of one selected from the group consisting of BPSG, SiO$_2$, and SiNx.

11. The method according to claim 10, wherein the insulating layer is an LTO layer, and the etching gas in the second RIE is a mixture of trifluoromethane, tetrafluoromethane and argon gas.

12. The method according to claim 1, wherein the first gate conductor consists of polycrystalline silicon.

13. The method according to claim 1, wherein the second gate conductor consists of at least one selected from the group consisting of W, Ti, Ta, Mo, TiN, TaN, HfN, to and MoN.

14. The method according to claim 1, wherein in the step of selectively etching the first gate stack, the first gate dielectric is removed.

15. The method according to claim 14, further comprising the step of forming a second gate dielectric in the opening between the step of selectively etching the first gate stack and the step of forming the second gate conductor.

* * * * *

UNITED STATES PATENT AND TRADEMARK OFFICE
CERTIFICATE OF CORRECTION

PATENT NO. : 8,324,061 B2
APPLICATION NO. : 13/129419
DATED : December 4, 2012
INVENTOR(S) : Huaxiang Yin et al.

It is certified that error appears in the above-identified patent and that said Letters Patent is hereby corrected as shown below:

On the Title page:

- Item (30) Foreign Application Priority Data, the application number is listed as "2010 1 0601699" and it should read -- 2010 1 0601699.9 --.

- Item (56) References Cited - Other publications, line 1, a phrase "on 101661902" should read -- CN 101661902 --.

- Column 10, claim 13, line number 56, a phrase "HfN, to and MoN." should read -- HfN, and MoN. --.

Signed and Sealed this
Twenty-sixth Day of February, 2013

Teresa Stanek Rea
*Acting Director of the United States Patent and Trademark Office*